(12) United States Patent  (10) Patent No.: US 7,875,524 B2
Kim  (45) Date of Patent: Jan. 25, 2011

(54) METHOD OF FABRICATING AN INDUCTOR FOR A SEMICONDUCTOR DEVICE

(75) Inventor: Nam Joo Kim, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 364 days.

(21) Appl. No.: 11/643,909

(22) Filed: Dec. 22, 2006

(65) Prior Publication Data

US 2007/0152299 A1    Jul. 5, 2007

(30) Foreign Application Priority Data

Dec. 29, 2005   (KR) ...................... 10-2005-0134225

(51) Int. Cl.
*H01L 21/304* (2006.01)

(52) U.S. Cl. .................. 438/381; 257/531; 257/277; 336/200; 336/205; 336/232

(58) Field of Classification Search ................ 257/531, 257/277; 336/200, 205, 232, 187, 220
See application file for complete search history.

(56) References Cited

U.S. PATENT DOCUMENTS 5,446,311 A * 8/1995 Ewen et al. ................. 257/531

5,656,849 A * 8/1997 Burghartz et al. ........... 257/528
6,426,267 B2 * 7/2002 Liou ........................... 438/319
6,559,751 B2   5/2003 Liu et al.

FOREIGN PATENT DOCUMENTS

CN    1141738    3/2004

OTHER PUBLICATIONS

Office Action for Chinese patent app. 200610172437.9.

* cited by examiner

*Primary Examiner*—Marcos D. Pizarro
*Assistant Examiner*—Eva Montalvo
(74) *Attorney, Agent, or Firm*—Lowe Hauptman Ham & Berner LLP

(57) ABSTRACT

The inductor for a semiconductor device includes at least one dielectric pattern selectively formed on a top of the interlayer dielectric, at least one first metal wire formed on a top of the interlayer dielectric, at least one second metal wire formed on a top of the dielectric pattern, and an upper protective film formed on the top of the interlayer dielectric to completely cover the first and second metal wires, wherein the first and second metal wires are alternately arranged at different vertical locations and are formed in a spiral configuration.

8 Claims, 3 Drawing Sheets

METHOD OF FABRICATING AN INDUCTOR FOR A SEMICONDUCTOR DEVICE

FIELD OF THE INVENTION

The present invention relates to fabricating a semiconductor device and, more particularly, to an inductor for a semiconductor device, which can expand the usable frequency band of an inductor by decreasing the parasitic capacitance between adjacent metal wires of the inductor, and to a method of fabricating the inductor.

BACKGROUND OF THE INVENTION

Generally, an inductor is one component constituting a circuit for Radio Frequency (RF) transmission/reception, and is essentially used in RF devices and analog devices, which have been widely used with the expansion of the wireless communication market. An inductor is generally formed in a spiral structure. Such an inductor having a spiral structure is disadvantageous in that the self-resonant frequency thereof decreases due to parasitic capacitance between the metal wires of the inductor.

Generally, the transition frequency point of an inductor at which the input impedance of the inductor changes from inductance to capacitance as the frequency increases is referred to as a self-resonant frequency. An inductor is mainly used at a frequency lower than the self-resonant frequency. In the case of an inductor having a spiral configuration, as the inductance value of a device increases, the size of the device increases and a parasitic component also increases so that the self-resonant frequency of the inductor decreases. This results in an actual reduction of a usable frequency band.

Hereinafter, a conventional inductor is described with reference to the drawings. FIG. 1A is a plan view showing a conventional inductor, and FIG. 1B is a sectional view taken along line A-A of FIG. 1A.

Referring to FIGS. 1A and 1B, an interlayer dielectric 11 is formed on the top of a silicon substrate 10, and is then planarized. Thereafter, an inductor metal wire 12 having a spiral structure is formed on the interlayer dielectric 11. The inductor metal wire 12 is connected to a lower metal wire 12, through a via (not shown). An upper protective film 13 is formed on the inductor metal wire 12.

The parasitic capacitance of the inductor having a spiral structure increases as the interval (a) between the inductor metal wires 12 is narrowed, which results in the decrease in the self-resonant frequency and, also the reduction in the usable frequency band of the inductor accordingly.

SUMMARY OF THE INVENTION

The present invention is therefore directed to providing an inductor for a semiconductor device which can expand the usable frequency band of the inductor by decreasing the parasitic capacitance between inductor metal wires, and a method of fabricating the inductor.

In accordance with an embodiment of the present invention, there is provided an inductor for a semiconductor device, comprising an interlayer dielectric formed on a top of a silicon substrate, at least one dielectric pattern selectively formed on a top of the interlayer dielectric, at least one first metal wire formed on top of the interlayer dielectric, at least one second metal wire formed on top of the dielectric pattern, and an upper protective film formed on the top of the interlayer dielectric to completely cover the first and second metal wires, wherein the first and second metal wires are alternately arranged at different vertical locations and are formed in a spiral configuration.

Advantageously, in the inductor according to the present invention, the dielectric pattern may have a thickness greater than that of the first metal wire.

In accordance with another embodiment of the present invention, there is provided a method of fabricating an inductor for a semiconductor device, comprising forming an interlayer dielectric on top of a silicon substrate, selectively forming at least one dielectric pattern on top of the interlayer dielectric, forming at least one first metal wire on top of the interlayer dielectric and forming at least one second metal wire on top of the dielectric pattern, and forming an upper protective film on the top of the interlayer dielectric to completely cover the first and second metal wires, wherein the first and second metal wires are alternately arranged at different vertical locations and are formed in a spiral structure.

Advantageously, in the method according to this particular embodiment of the present invention, the forming the first and second metal wires may comprise depositing a metal layer on entire surfaces of the dielectric pattern and the interlayer dielectric, and etching the metal layer. Advantageously, the dielectric pattern may be formed to have a thickness greater than that of the first metal wire.

BRIEF DESCRIPTION OF THE DRAWINGS

The above and other features of the present invention will become apparent from the following description of exemplary embodiments given in conjunction with the accompanying drawings, in which.

DETAILED DESCRIPTION OF THE EXEMPLARY EMBODIMENTS

Figure 1A:
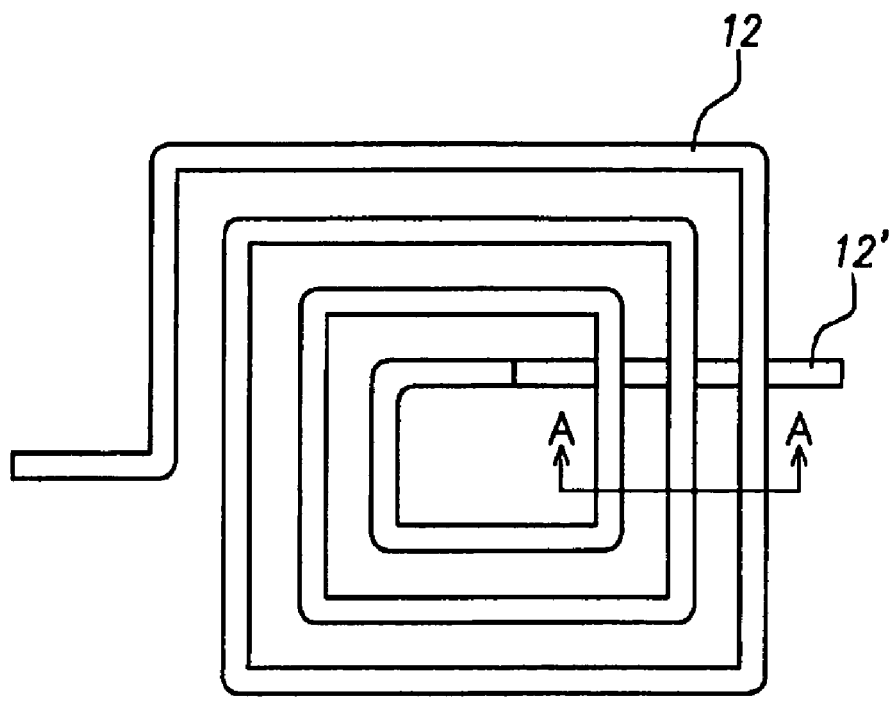
FIGS. 1A and 1B are a plan view and a sectional view showing a conventional inductor.
Figure 1B:
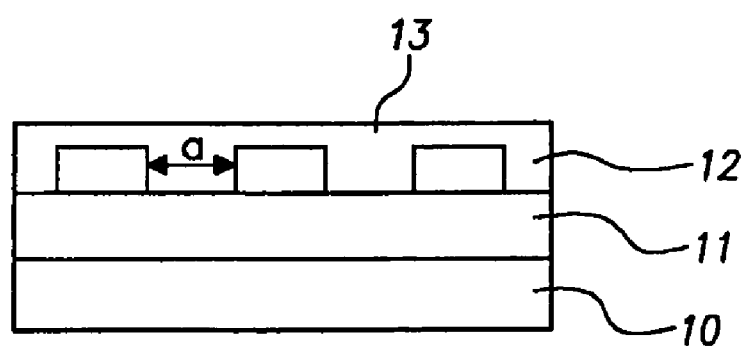

Hereinafter, preferred embodiments of the present invention will be described in detail with reference to the accompanying drawings to the degree that they can be readily implemented by those skilled in the art.

A description of technical content that is well known to those skilled in the art and which is not directly related to the present invention is, for the sake of brevity, omitted when embodiments of the present invention are described. This is done to avoid clouding the disclosure which issues which do not directly pertain to the pith of the invention. For the same reason, some components in the drawings are exaggerated, omitted, or schematically shown. The sizes of respective components in the drawings do not reflect actual sizes.

Figure 2A:
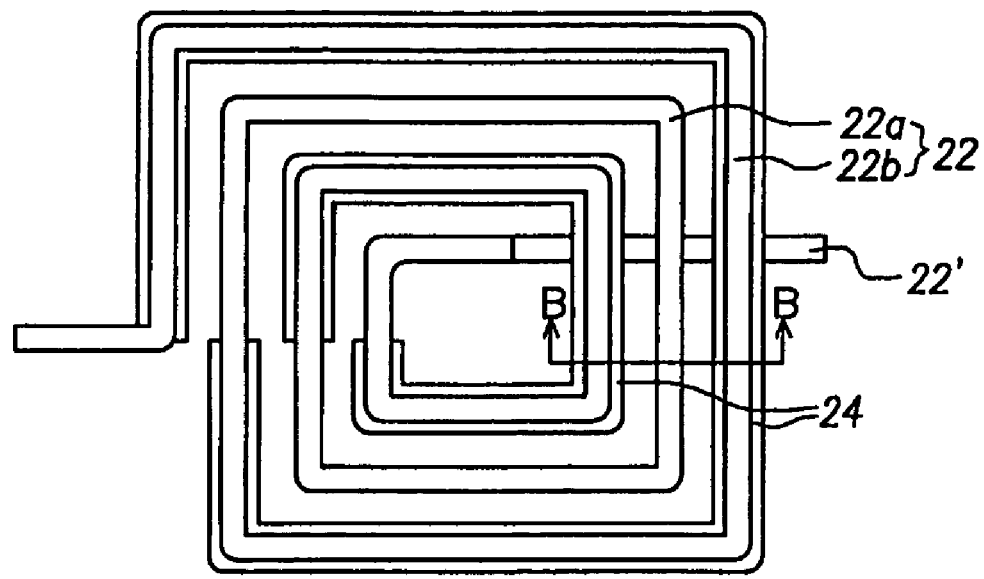
FIGS. 2A and 2B are a plan view and a sectional view showing an inductor according to an embodiment of the present invention.
Figure 2B:
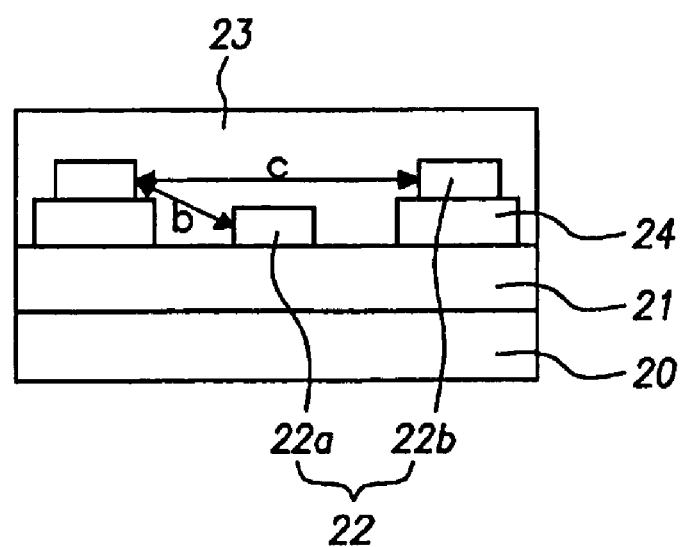

FIG. 2A is a plan view showing an inductor according to an embodiment of the present invention. FIG. 2B is a sectional view taken along line B-B of FIG. 2A.

Referring to FIGS. 2A and 2B, an inductor metal wire 22 having a spiral structure is formed on the top of an interlayer dielectric 21 which is formed on the top of a silicon substrate 20. The inductor metal wire 22 is connected to a lower metal wire 22' through a via (not shown), and an upper protective film 23 is formed on the inductor metal wire 22.

The inductor metal wire 22 is divided into two types of metal wires arranged at different vertical locations. First metal wires 22a are formed directly on the top of the interlayer dielectric 21, and second metal wires 22b are formed on dielectric patterns 24, which are selectively formed on the top of the interlayer dielectric 21. Further, the first metal wires 22a and the second metal wires 22b are alternately formed, thus preventing metal wires being arranged at the same vertical location and from being adjacent to each other.

As described above, since the first metal wires 22a and the second metal wires 22b are alternately arranged at different vertical locations, the intervals b and c between the inductor metal wires are widened. Accordingly, the parasitic capacitance decreases, and the self-resonant frequency increases, thus the usable frequency band can be expanded.

Figure 3A:
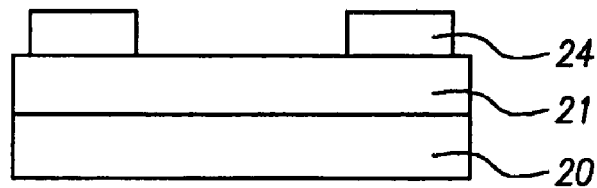
FIGS. 3A to 3C are sectional views showing a method of fabricating an inductor according to an embodiment of the present invention.
Figure 3B:
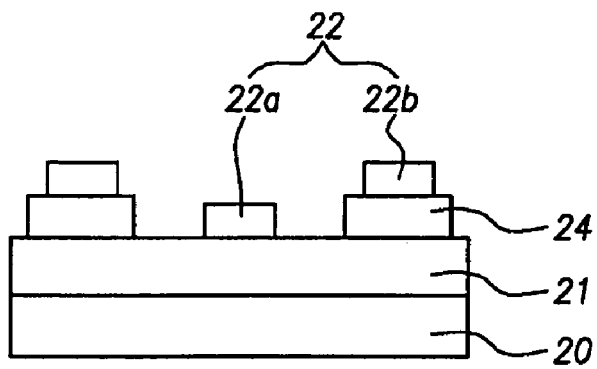
Figure 3C:
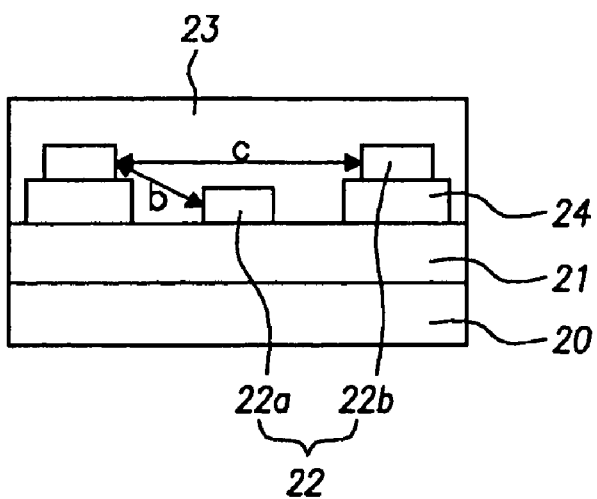

Hereinafter, a method of fabricating an inductor is described. The structure of an inductor is also further clarified from the later description of the fabricating method. FIGS. 3A to 3C are sectional views showing the method of fabricating an inductor according to an embodiment of the present invention.

First, as shown in FIG. 3A, the interlayer dielectric 21 is formed on the top of the silicon substrate 20, and is planarized. Next, the dielectric patterns 24 are selectively formed on the top of the interlayer dielectric 21. The dielectric patterns 24 are each made of an oxide film or a nitride film, and is preferably formed to be thicker than inductor metal wires that are to be formed later.

Next, as shown in FIG. 3B, the first and second metal wires 22a and 22b, which constitute the inductor metal wire 22 for the inductor, are formed. The first and second metal wires 22a and 22b can be formed using a method of depositing a metal layer on the entire surfaces of the interlayer dielectric 21 and the dielectric patterns 24 and patterning the metal layer at one time through a photo etching process. In this case, the first metal wires 22a are formed directly on the top of the interlayer dielectric 21, and the second metal wires 22b are formed on the top of the dielectric patterns 24, so that the first and second metal wires 22a and 22b are arranged at different vertical locations. Further, the first and second metal wires 22a and 22b are alternately formed, thus preventing metal wires arranged at the same vertical location from being adjacent to each other.

Next, as shown in FIG. 3C, the upper protective film 23 is formed to completely cover the inductor metal wire 22.

As described above, the present invention provides an inductor and a method of fabricating the inductor, in which dielectric patterns are selectively formed on the top of an interlayer dielectric, and first and second metal wires are alternately formed on the top of the interlayer dielectric and the dielectric patterns, so that inductor metal wires arranged at different vertical locations can be realized. Accordingly, the present invention is advantageous in that, since the interval between inductor metal wires is widened, compared to the case where all inductor metal wires are arranged at the same vertical location, the parasitic capacitance decreases, and the self-resonant frequency increases, thus the usable frequency band can be expanded.

Although the invention has been shown and described with respect to a limited number of embodiments, and specific terms have been used, the exemplary embodiments and specific terms are used in their general meaning only, in order to easily describe the technical content of the present invention and to facilitate the understanding of the present invention, and are not intended to limit the scope of the present invention. It will be understood by those skilled in the art that various changes and modifications may be made without departing from the spirit and scope of the invention as defined in the following claims.

What is claimed is:

1. A method of fabricating an inductor for a semiconductor device, comprising:

forming an interlayer dielectric on a top surface of a silicon substrate;

selectively forming at least one dielectric pattern on a top surface of the interlayer dielectric;

forming at least one first metal wire portion on a top surface of the interlayer dielectric and forming at least one second metal wire portion on a top surface of the dielectric pattern, the first and the second metal wire portions being parts of a contiguous metal wire for the inductor; and forming an upper protective film on the top surface of the interlayer dielectric to completely cover the first and second metal wire portions, wherein the first and second metal wire portions are alternately arranged at different vertical locations and are formed in a spiral configuration.

2. The method of claim 1, wherein the forming the first and second metal wire portions comprises depositing a metal layer on entire top surfaces of the dielectric pattern and the interlayer dielectric, and patterning the metal layer.

3. The method of claim 2, wherein the patterning pf the metal layer performed at one time through a photo etching process.

4. The method of claim 1, wherein the dielectric pattern is formed to have a thickness greater than that of the first metal wire portion.

5. The method of claim 1, further comprising:

planarizing the interlayer dielectric before the selectively forming the at least one dielectric pattern.

6. The method of claim 1, wherein the at least one dielectric pattern is made of an oxide film or a nitride film.

7. A method of fabricating an inductor for a semiconductor device, comprising:

forming an interlayer dielectric on a top surface of a silicon substrate;

selectively forming at least one dielectric pattern on a top surface of the interlayer dielectric;

forming a contiguous metal wire including at least one first metal wire portion on a top surface of the interlayer dielectric and at least one second metal wire portion on a top surface of the dielectric pattern; and forming an upper protective film on the top surface of the interlayer dielectric to completely cover the contiguous metal wire, wherein the forming the contiguous metal wire includes depositing a metal layer on entire surfaces of the interlayer dielectric and the dielectric patterns, and patterning the metal layer at one time through a photo etching process, so that the at least one first metal wire portion and the at least one second metal wire portion are alternately arranged at different vertical locations and are formed in a spiral configuration.

8. The method of claim 7, wherein the dielectric pattern is formed to have a thickness greater than that of the first metal wire portion.

* * * * *